United States Patent [19]
Nicolai

[11] Patent Number: 5,027,118
[45] Date of Patent: Jun. 25, 1991

[54] ANALOG SIGNAL LOGARITHMIC ENVELOPE DETECTOR

[75] Inventor: Jean Nicolai, Aix en Provence, France

[73] Assignee: SGS Thomson Microelectronics S.A., Gentilly, France

[21] Appl. No.: 406,158

[22] Filed: Sep. 12, 1989

[30] Foreign Application Priority Data

Sep. 16, 1988 [FR] France .................................. 88 12119

[51] Int. Cl.⁵ ............................................ H03M 1/62
[52] U.S. Cl. .................... 341/132; 341/138; 328/149
[58] Field of Search ............... 341/132, 157, 155, 165, 341/164; 329/348, 361, 363, 364; 328/28, 135, 146, 149, 150

[56] References Cited

U.S. PATENT DOCUMENTS

| | | | |
|---|---|---|---|
| 3,292,150 | 12/1966 | Wood | 341/132 |
| 3,600,565 | 8/1971 | Forbes | 328/135 |
| 4,001,604 | 1/1977 | Parks et al. | 328/28 |
| 4,769,613 | 9/1988 | Sawata et al. | 328/149 |

FOREIGN PATENT DOCUMENTS

0224935 12/1986 European Pat. Off. ............ 329/168
0274787 12/1987 European Pat. Off.

OTHER PUBLICATIONS

Electronic Design, vol. 33, No. 1, Jan. 1985, "1985 Technology Forecast", pp. 200-218.
Elektor Electronics. vol. 14, No. 158, p. 10, "3.75 Digit DPM", National Semiconductor.

*Primary Examiner*—William M. Shoop, Jr.
*Assistant Examiner*—Brian K. Young
*Attorney, Agent, or Firm*—Roland Plottel

[57] ABSTRACT

Disclosed is an analog signal envelope detector, namely a detector that gives a signal representing the slow, overall variations but not the instantaneous variations of the level of an analog signal applied to its input. The detector according to the invention uses a logarithmic compression analog-digital coder of the type used in cofidec circuits for telephone sets. A counter gives the envelope signal sought. A comparator compares the content of the counter and the output of the coder. Depending on the orientation of the comparison, it increments or decrements the counter. The incrementation is made at a frequency which is much faster than the decrementation. The result of this is that the content of the counter represents the envelope of the slow variations of the input signal.

5 Claims, 2 Drawing Sheets

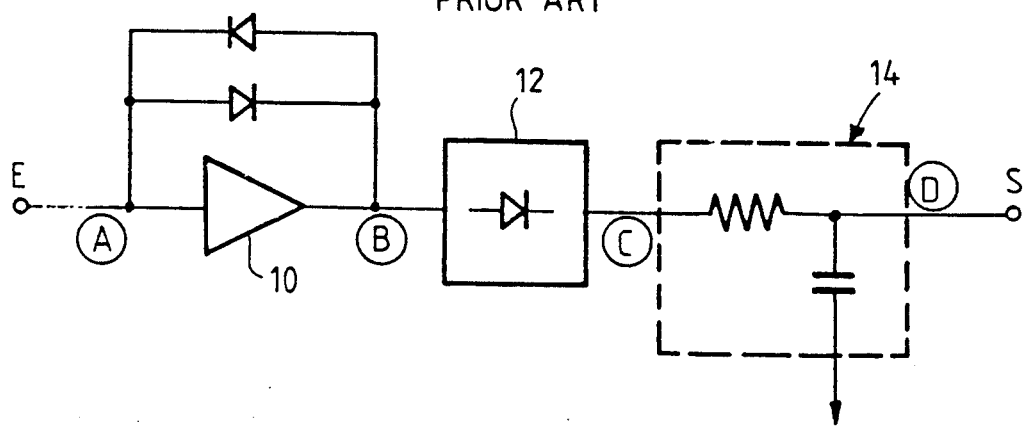
FIG_1
PRIOR ART
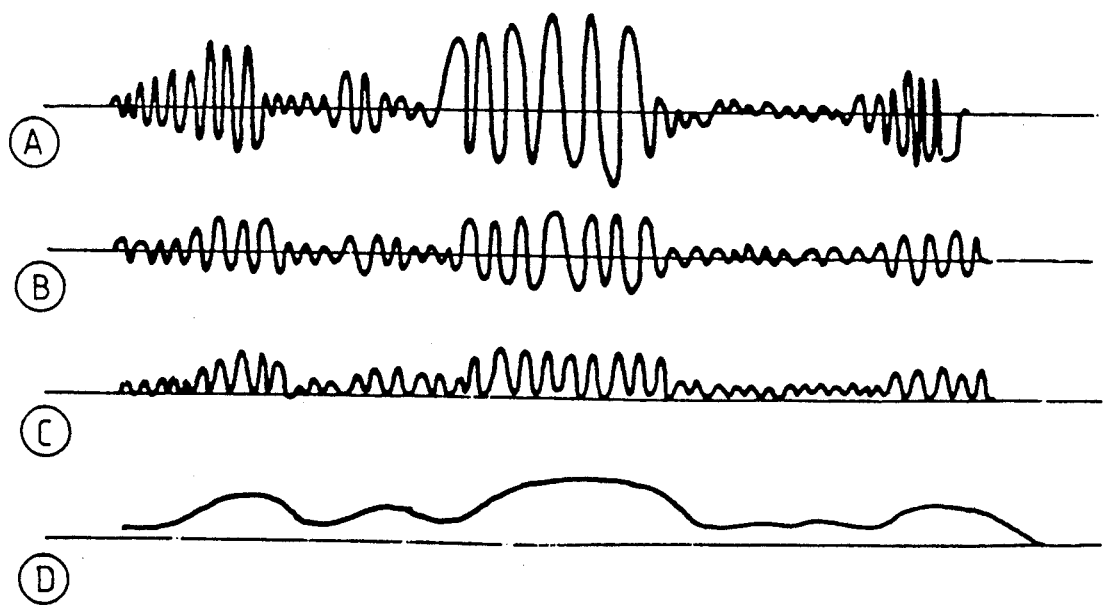
FIG_2
PRIOR ART

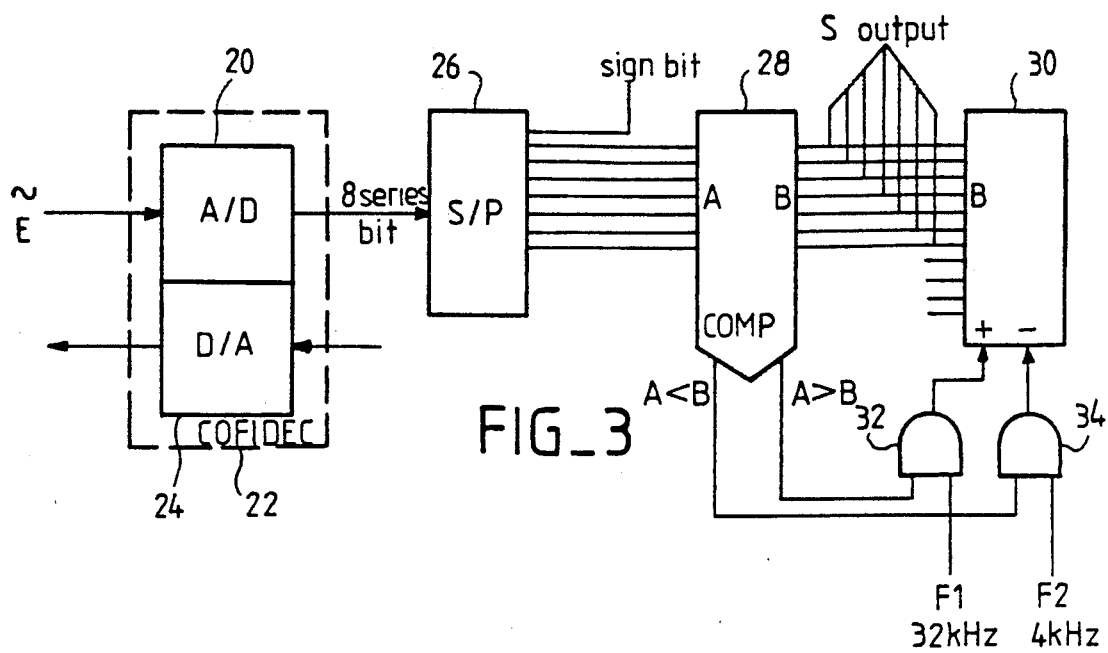
FIG_3
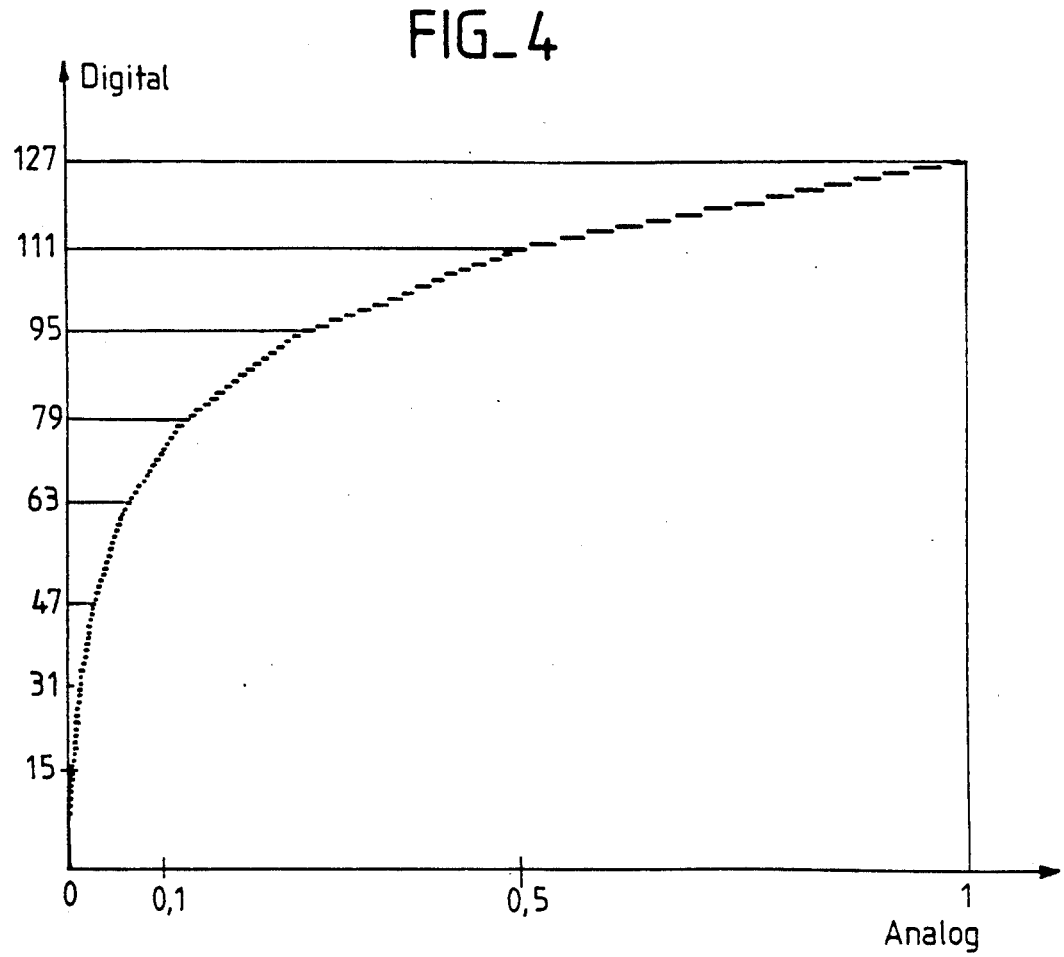
FIG_4

ANALOG SIGNAL LOGARITHMIC ENVELOPE DETECTOR

BACKGROUND OF THE INVENTION

1. Field of the Invention

The invention concerns an analog signal logarithmic envelope detector, namely a detector that gives a signal representing the slow overall variations but not the instantaneous variations of the level of an analog signal applied to its input. The signal representing the overall variations of the input signal broadly follows the contour of the maximum values of the input signal, and this is why we speak of a signal envelope detector.

However, the detector concerned herein is a logarithmic detector, that is, the overall variations of the signal are measured with a logarithmic scale: for the small levels of signal input, the variations are taken into account with a high coefficient, and the more the signal level increases, the more the variations are taken into account with a low multiplier coefficient.

By way of an example, signal logarithmic envelope detectors are useful in the analysis of speech. The signal for which it is sought to measure the envelope is the speech signal. It is thus possible to know the mean sound level of the speech at the input. A very concrete example of the use of signal envelope logarithmic detectors may be found in telephone sets with amplified listening facility. The mean level of a signal emitted on the line is compared with the level of the signal received from the line. Moreover, it is ascertained that the signal emitted or received is rather a noise signal or rather a speech signal, and action is taken on the gain of the emission and reception amplifiers, depending on the result of these determinations, so as to avoid any Larsen effect. Logarithmic envelope detectors are used to determine, at each instant, the mean level emitted or received. They have a logarithmic characteristic to improve the detection and the comparisons for the small signals without risk of saturation for the big signals.

2. Description of the Prior Art

Analog signal envelope detectors with logarithmic function are made in the prior art according to the diagram shown in FIG. 1.

They comprise essentially a logarithmic gain amplifier 10 receiving the analog signal, the level of which has to be controlled. This amplifier is followed by a full wave rectifier 12 when the input signal has positive and negative half cycles. The rectifier is followed by a smoothing RC integrator 14, the time constant of which is chosen to make the fast variations of signals disappear and to preserve the slow variations of the envelope.

The output of the detector is taken at the output of the RC integrator.

The logarithmic amplifier is an operational amplifier looped between its output and its input by two diodes in parallel, upside down with respect to each other. Since the diodes have a logarithmic current/voltage curve when they are in direct mode and since, at any instant, at least one of the diodes is in direct mode, the amplifier has a logarithmic amplification coefficient, the amplification being far greater for the small signals than for the big ones.

FIG. 4 shows, as an example, a waveform of an analog signal received at the input of the envelope detector of FIG. 1 (line A). The line B represents the logarithmically compressed signal, at output of the amplifier 10. The range of variation of the signals has been reduced. The amplitude ratio between the small signals and the big ones is considerably smaller than on the line A. The line C represents the signal at output from the rectifier 12. Finally, the line D represents the output signal of the RC integrator 14. The fast variations of the input signal have disappeared. All that remain are the slow variations representing the envelope of the input analog signal or its mean level, but with a logarithmic scale.

In the embodiment taking the form of an integrated circuit, frequently necessary when it is desired to circuit, frequently reduce costs and bulk, it is sometimes difficult to make a logarithmic envelope detector of this kind.

For, it is practically not possible to make it by means of standard MOS technologies because the way to integrate two diodes in parallel and upside down with respect to each other is not known. Now, MOS circuits are very useful for all sorts of logic functions and this, therefore, rules out the possibility of integrating, in one and the same integrated circuit, both MOS logic functions and the envelope detector which may be needed to control these logic functions.

It is true that bipolar technologies enable the integration of both the diodes upside down with respect to each other, and it is a pity to have to be restricted to a bipolar technology only because two diodes, out of thousands of elements of the integrated circuit, cannot be integrated.

Moreover, whether the technology used is MOS technology or bipolar technology, the circuit of FIG. 1 requires high-value capacitances for the smoothing, and these capacitances cannot be integrated.

To avoid the drawbacks of the prior art, the present invention proposes an analog signal logarithmic envelope detector using a logarithmic compression analog-digital coder as a basic element.

As is known, circuits commonly called "cofidecs" are being manufactured in large quantities. Cofidecs are integrated circuits designed for telephone sets. They integrate an analog-digital coding-decoding function and signal filtering functions on one and the same integrated circuit chip.

Now, the analog-digital coder of a cofidec is a logarithmic or almost logarithmic compression coder.

The idea of the present invention is to use this coder as a basic, low-cost element which can be made by means of MOS technology to create an analog signal envelope detector.

The envelope detector will be made with a circuit that is identical to a standard cofidec, of which only the coder part and not the decoder part will be used.

The analog signal for which the mean level is measured will be applied to the input of this coder. The digital output of the coder, representing the amplitude (in terms of absolute value) of the signal will be compared to the content of a counter. If the analog signal digitalized by the encoder is greater than the content of the counter, the counter is incremented, with a relatively high frequency F1. If, on the contrary, the digitalized analog signal will become smaller than the content of the counter, the counter is decremented, but with a lower frequency FR2. The content of the counter then represents a digital approximation of the envelope of the input signal.

There is no need for a rectifier as in the prior art. The standard cofidec gives a digital signal, of which one most significant bit represents the sign and the other bits represent the amplitude of the signal in terms of absolute value of the signal. It therefore suffices to compare the content of the counter with the amplitude bits of the digitalized analog signal in eliminating the sign bit.

There is no need for any RC integrator. The peak value detecting function, fulfilled in FIG. 1 by the rectifier/RC integrator unit, is fulfilled herein by the counter (the incrementation frequency of which is greater than the decrementation frequency) and the comparator which can very easily be totally integrated into a MOS technology circuit. However, the output signal from the envelope detector according to the invention is a digital signal here, and not an analog one. Most usually, this is of no importance for the final goal is to compare the level of the envelope signal with a determined value or with another signal, and these comparisons can be done on digital signals as well as on analog signals.

SUMMARY OF THE INVENTION

According to a more detailed aspect of the invention, the analog signal envelope detector therefore has a logarithmic compression analog-digital coder having analog signal input terminals and digital signal output terminals, a digital counter having a counter input and a countdown input, a digital comparator connected, firstly, to the digital output terminals of the coder and, secondly, to the outputs of the counter, and a control logic circuit connected to the output of the comparator and capable of controlling the incrementation of the counter at a first frequency, or the decrementation of the counter at a second frequency which is different from the first frequency, depending on the state of the counter, the output of the detector being connected to the outputs of the counter.

The counting frequency will, in principle, be higher than the countdown frequency. For example, it is eight times higher.

The counting frequency depends on the speed at which it is desired that the counter should follow the variations of the input signal.

The countdown frequency will be all the lower as it is desired to have slower variations of the envelope signal. It acts like the cut-off frequency of the RC integrator of FIG. 1.

BRIEF DESCRIPTION OF THE DRAWINGS

Other characteristics and advantages of the invention will appear from the reading of the following detailed description, made with reference to the appended drawings, of which:

FIG. 1 already described, represents the prior art;

FIG. 2 illustrates the signal waveforms in the circuit of FIG. 1;

FIG. 3 represents an analog signal envelope detector according to the invention;

FIG. 4 represents the standard conversion curve of a cofidec, showing the logarithmic compression of the analog input towards the digital output.

DESCRIPTION OF PREFERRED EMBODIMENTS

The analog signal for which it is sought to control the mean level is applied to an input E of the envelope detector shown in FIG. 3.

The detector has a logarithmic compression analog-digital coder, designated by the reference 20. This coder may be formed by a part of a standard cofidec circuit 22, of which the other part 24, which is not used here, is a digital-analog coder. The cofidecs used in telephone sets are perfectly suitable because they have a characteristic of conversion with logarithmic compression. The system will use either the entire cofidec, which has the advantage of being a low-cost, standard circuit, with the digital-analog coder remaining unused, or else it will use only a circuit 20 identical to the analog-digital coder part of a cofidec.

The coder 20 has an analog input side and a digital output side.

The input E is connected to the analog input of the coder 20. The output is a binary series output, the binary words being coded, for example, on eight bits, including one sign bit. We shall return further below to the coding of the input analog signal.

The series output is applied to the input of a series-parallel converter 26 which converts each series eight-bit word into a parallel eight-bit word. Of course, this series-parallel converter is not necessary in the case where the output of the coder 20 is directly a parallel output. This can be envisaged, although present-day cofidecs are more likely to have series outputs.

The eight parallel outputs of the converter 26 include an output giving a sign bit of the analog signal. This output is not used to detect the signal envelope. The seven other outputs define the amplitude, in terms of absolute value, of the logarithmically compressed analog signal, and make this definition according to a binary code.

The binary coding of the amplitude of the analog signal is shown for a standard cofidec in FIG. 4.

The x-axis represents the amplitude of the signal according to a linear scale (which is arbitrary: a minimum amplitude of 0 and a maximum amplitude of 1 are considered). The y-axis also uses a linear scale to give a decimal digital representation of the binary output. In other words, while the seven output bits can take all the binary values between 0000000 and 1111111, these values have been represented by corresponding decimal numbers from 0 to 127.

As can be seen, a curve with a generally logarithmic shape (which, however, varies in the form of a staircase) represents the digital value of the output binary code as a function of the amplitude of the input analog signal.

The logarithmic curve is divided into eight straight-line segments. The segments are coded by the three most significant bits of the binary output. Consequently, the first segment corresponds to the digital values 0 to 15, the second segment corresponds to the digital values 16 to 31, the third to the values 32 to 47, etc, up to the eighth segment which corresponds to the values 111 to 127.

The coding of the three bits defining the segment corresponding to a range of given amplitudes is substantially logarithmic inasmuch as, to keep to the substantially logarithmic shape of the curve plotted in FIG. 4, the successive segments have slopes varying in logarithmic progression. It is clearly seen in FIG. 4 that, for the very small signals (smaller than 1% of the maximum), the slope is very steep while, for the big signals, it is very slight. In practice, the first straight-line segment is used to code only the signals with amplitude between 0% and 1% of the maximum value, while the last segment is used by itself to code the signals with amplitude between 50% and 100% of the maximum.

Within each straight-line segment, the four least significant bits are used to define the precise value of the analog signal. This time, the coding is linear and not logarithmic, i.e., if the analog signal is incremented by a given step value (16 identical steps to go through the entire segment), then the digital value is incremented by one unit (one less significant bit).

Returning to FIG. 3, the envelope detector also has a seven-bit digital comparator 28 and a digital counter 30.

The parallel outputs of the converter 26 are connected by one side of the comparator 28. The seven most significant outputs of the counter 30 are connected by the other side of the comparator 28.

The counter 30 is, for example, an 11-bit counter. It has a counting input (+) and a countdown input (−).

The comparator 28 has two outputs (or one output and one logic circuit to set up two complementary outputs). One of the outputs gives a signal authorizing incrementation of the counter when the logarithmically digitalized amplitude A of the analog signal is greater than content B of the counter 30 (defined from its seven most significant bits). The other output gives a signal authorizing decrementation of the counter when the digitalized amplitude A of the analog signal is smaller than the content B of the counter.

An incrementation clock signal at frequency F1 is applied to the incrementation input of the counter through a validation gate 32 controlled by the incrementation signal at output of the comparator. Conversely, a decrementation clock signal at frequency F2 is applied to the decrementation input through a validation gate 34 controlled by the decrementation signal at output of the comparator.

The incrementation frequency F1 is far higher than the decrementation frequency F2.

In an example where the analog-digital coder gives an eight-bit word every 125 milliseconds (8 kilohertz conversion frequency), we can take an incrementation frequency of 32 kilohertz and a decrementation frequency of 4 kilohertz.

The output of the envelope detector is a digital output taken on the seven most significant bits of the counter 30.

The circuit works in the following way: if the signal grows in such a way that its logarithmically digitalized value A exceeds the level indicated by the seven most significant bits of the counter, then the counter gets incremented rapidly, and the counter tends to follow the level of the signal, with a response time which, however, is limited by the counting frequency. When the signal is again below the content of the counter, either because the content of the counter finally catches up with the analog signal or because the signal has again fallen, the counter is decremented, but very slowly, so that the counter retains the maximum level, previously reached by the analog signal, in memory with a major time constant. It is in this sense that the output of the detector represents (in digital form) the envelope of the slow variations of the analog signal.

The envelope detector according to the invention will be preferably integrated, by MOS technology, with other circuits. As can be seen, it requires no capacitance unlike in the case of FIG. 1. The time constants are defined by the clock frequencies. This is far more precise than is the case with values of capacitances, resistances or currents.

What is claimed is:

1. An analog signal envelope detector including a logarithmic compression analog-digital coder having analog signal input terminals and digital signal output terminals, a digital counter having a counter input and a countdown input, a digital comparator connected, firstly, to the digital output terminals of the coder and, secondly, to the outputs of the counter, and a control logic circuit connected to the output of the comparator and capable of controlling the incrementation of the counter at a first frequency, or the decrementation of the counter at a second frequency which is different from the first frequency, depending on the state of the counter, the output of the detector being connected to receive signals from the outputs of the counter.

2. A detector according to claim 1, wherein the coder is the analog-digital coder of a standard cofidec circuit.

3. A detector according to either of the claims or 2, wherein the first frequency is higher than the second frequency.

4. A detector according to either of the claims 1 or 2, wherein the coder outputs binary words having, firstly, a sign bit and, secondly, bits defining the amplitude in terms of absolute value of the analog signal, only the latter bits being applied to the comparator.

5. A detector according to either of the claims or 2, wherein the counter has most significant outputs and least significant outputs, only the most significant outputs being applied to the comparator.

* * * * *